(12) United States Patent  (10) Patent No.: US 7,058,754 B2
Frayer  (45) Date of Patent: Jun. 6, 2006

(54) NONVOLATILE MEMORY DEVICE CAPABLE OF SIMULTANEOUS ERASE AND PROGRAM OF DIFFERENT BLOCKS

(75) Inventor: Jack Edward Frayer, Boulder Creek, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 351 days.

(21) Appl. No.: 10/744,561

(22) Filed: Dec. 22, 2003

(65) Prior Publication Data

US 2005/0138273 A1  Jun. 23, 2005

(51) Int. Cl.
*G06F 12/00* (2006.01)

(52) U.S. Cl. ...................... 711/102; 711/103
(58) Field of Classification Search ............... None
See application file for complete search history.

(56) References Cited

U.S. PATENT DOCUMENTS

| | | | |
|---|---|---|---|
| 5,029,130 A | 7/1991 | Yeh | |
| 5,553,261 A | 9/1996 | Hasbun et al. | |
| 5,602,987 A | 2/1997 | Harari et al. | |
| 5,818,761 A | 10/1998 | Onakado et al. | |
| 5,847,998 A * | 12/1998 | Van Buskirk | 365/185.33 |
| 6,047,352 A * | 4/2000 | Lakhani et al. | 711/5 |
| 6,081,450 A | 6/2000 | Nawaki | |
| 6,507,885 B1 * | 1/2003 | Lakhani et al. | 711/5 |
| 6,567,307 B1 | 5/2003 | Estakhri | |
| 6,571,312 B1 | 5/2003 | Sugai et al. | |
| 6,961,805 B1 * | 11/2005 | Lakhani et al. | 711/5 |
| 6,965,527 B1 * | 11/2005 | Fasoli et al. | 365/189.01 |

* cited by examiner

*Primary Examiner*—T Nguyen
(74) *Attorney, Agent, or Firm*—DLA Piper Rudnick Gray Cary US LLP

(57) ABSTRACT

An integrated circuit memory device has a memory array which is partitioned into a plurality of blocks. Each block has an associated row decoder. Each block has a plurality of local bit lines connecting memory cells arranged in the same column. The row decoder is connected to a plurality of row lines which are connected to memory cells arranged in the same row. A plurality of global column lines traverse across a plurality of blocks with each global column line associated with a local bit line from each of the blocks. A column decoder is connected to the plurality of the global column lines. A switch connects each global column line with its associated local bit line from each of the blocks. A control circuit determines when a particular block is to be programmed and a different block needs to be erased and activates the switches accordingly to cause the erase voltage to apply to one block and the programming voltage to apply to the second block.

20 Claims, 2 Drawing Sheets

NONVOLATILE MEMORY DEVICE CAPABLE OF SIMULTANEOUS ERASE AND PROGRAM OF DIFFERENT BLOCKS

TECHNICAL FIELD

The present invention relates to a nonvolatile memory device having a plurality of blocks and being capable of erasing and programming memory cells from different blocks at the same time.

BACKGROUND OF THE INVENTION

Nonvolatile memory devices such as flash memory devices are well known in the art. Typically, a nonvolatile flash memory device is arranged in a plurality of blocks, with each block having a plurality of nonvolatile memory cells arranged in a plurality of rows and columns. In operation, a block of memory cells are erased together, simultaneously. In programming, selective memory cells of a block are programmed. All of the cells of a flash memory device must be erased before they can be programmed. Thus, as the data of memory cells of a block become "stale," the replacement data is programmed into memory cells in other blocks. Once all the memory cells in a certain block are "used" or "stale," then all the memory cells of that block are erased, simultaneously. However, typically, the operations of programming and erasing are not done simultaneously.

In the prior art, various disclosures have been made with regard to expediting the erasure of a block. See, for example, U.S. Pat. Nos. 6,571,312; 6,567,307; 5,553,261; 5,602,987; and 5,818,761. In U.S. Pat. No. 6,081,450, disclosure is made to a non-volatile semiconductor memory device in which write and erase operations can occur simultaneously in different array blocks. However, in that reference, two row decoders are used necessitating extra space on the integrated memory cell. Finally, the use of global bit lines connected to local bit lines is also disclosed. See, for example, U.S. Pat. No. 5,818,761, FIG. 10. However, this is not used to provide for simultaneous program and erase function in the same array.

Accordingly, it is one object of the present invention to improve the performance of a nonvolatile flash memory device.

SUMMARY OF THE INVENTION

In the present invention, a nonvolatile memory device comprises an array of nonvolatile memory cells which are arranged in a plurality of blocks. Each block has a plurality of nonvolatile memory cells which are arranged in a plurality of rows and columns. A plurality of local bit lines is in each block with each local bit line not extending to an adjacent block. Each local bit line connects the cells that are in the same column. A plurality of row lines in each block connects the cells that are in the same row. A plurality of global column lines extend across a plurality of different blocks. Each global column line is associated with a plurality of local bit lines. A plurality of switches is in each block. Each switch connects a local bit line to its associated global column line. Each switch is activatable by a switch signal supplied on a select line connected to the switch. A row decoder is connected to the plurality row lines and the select line of each block. A column decoder is connected to the plurality of global column lines. A controller circuit determines when the memory cells of a first block are to be erased and when memory cells of a second block are to be programmed and activates the row decoder associated with the second block to cause the switches of the second block to connect the local bit lines of the second block to the global column lines and causing simultaneous erasure of the memory cells of the first block and programming of memory cells of the second block to occur.

DETAILED DESCRIPTION OF THE INVENTION

Figure 1:
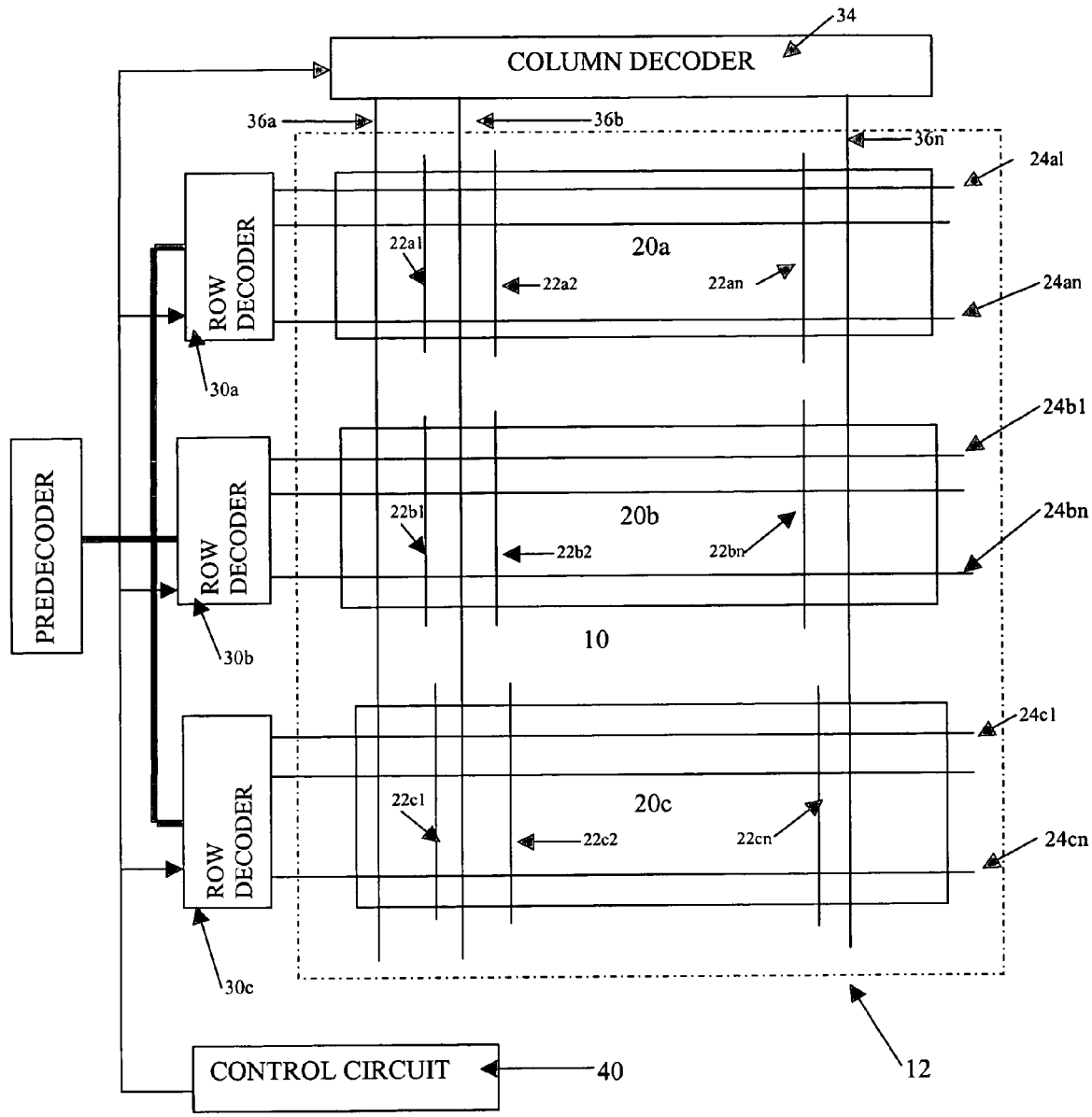
FIG. 1 is a block level diagram of the nonvolatile memory device of the present invention.

Referring to FIG. 1 there is shown a block level diagram of a memory device 10 of the present invention. The memory device 10 comprises an array 12 of nonvolatile memory cells arranged in a plurality of blocks (20a . . . 20c). Each block 20a has a plurality of nonvolatile memory cells 26 which are arranged in a plurality of rows and columns. A plurality of local bit lines 22a1 . . . 22an is in each block 20a. Each of the local bit lines 22 in each block 20a does not extend to an adjacent block 20b. Each local bit line 22a connects the memory cells 26 that are in the same column. A plurality of row lines 24a are in each block 20a with each row line 24a connecting cells 26 that are in the same row. Extending across the plurality of blocks 20a . . . 20c are a plurality of global column lines 36a . . . 36n. Each global column line 36 is associated with a plurality of local bit lines 22 with each local bit line 22 from a different block 20. Thus, for example, as shown in FIG. 1, the global column line 36a is associated with the local bit line 22a1 from block 20a and 22b1 from block 20b and local bit line 22c1 from block 20c. A column decoder 34 is connected to the plurality of global column lines 36. A row decoder 30 is associated with each block 20. The row decoder 30 may be a complete row decoder, i.e., completely decoding the row address or it can be a partial decoder with a pre-decoder 32 decoding the initial portion of the row address with each row decoder 30 associated with each block 20 decoding the rest of the row address. Either embodiment is within the scope of the present invention. Each row decoder 30 is connected to a plurality of row lines 24 that are supplied to each block 20. Each row line 24 extends across and connects to the memory cells 26 that are in the same row within each block 20. Within each block 20 is a plurality of switches 66 that connects each local bit line 22 to its associated global column line 36. Thus, as shown for example in FIG. 2, switch 66a connects the local bit line 22a1 to the global bit line 36a. A select line 52 connects to all the switches 66 and activates the switches 66. The select line 52 is also connected to the row decoder 30a and is activatable by the row decoder 30a. Finally a control circuit 40 activates and controls the operation of the plurality of row decoders 30 and column decoder 34.

Each block 20 may further comprise a plurality of second switches 64 with each second switch 64 connecting the local bit line 22a to a source of erase voltage Ve. The plurality of second switches 64 are connected to a second select line 50 and is activatable by the second select line 50. The second select line 50 is also connected to the row decoder 30.

As is well known, the memory device 10 is typically made of integrated circuits formed in a semiconductor substrate.

Each block 20 may further be made in a well within the semiconductor substrate. The well may be connected to the erase voltage Ve by a third switch 62. The third switch 62 may also be connected to the second select line 50.

The theory of operation of the memory device 10 in accordance with the present invention will now be explained. Although the description set forth hereinafter is with regard to the operation of the memory device 10 operating in conjunction with a particular type of memory cell 26, it should be noted that the present invention is not limited to the type of memory cell 26 described hereinafter.

Typically, memory cells of the nonvolatile floating gate flash type have been of two types: stacked gate or split gate. In a split gate nonvolatile floating gate memory cell, the floating gate is insulated from the channel and controls a portion of the conduction in the channel. A control gate is laterally spaced apart from the floating gate and controls another portion of the conduction in the channel. One mechanism of erasure is from the floating gate through the insulation separating the floating gate from the control gate to the control gate. This type of cell is exemplified by U.S. Pat. No. 5,029,130, whose disclosure is incorporated by reference herein. In a stacked gate, the floating gate controls the conduction of the entire channel. The present invention may be used with either stacked gate or split gate floating gate memory cells.

Figure 2:
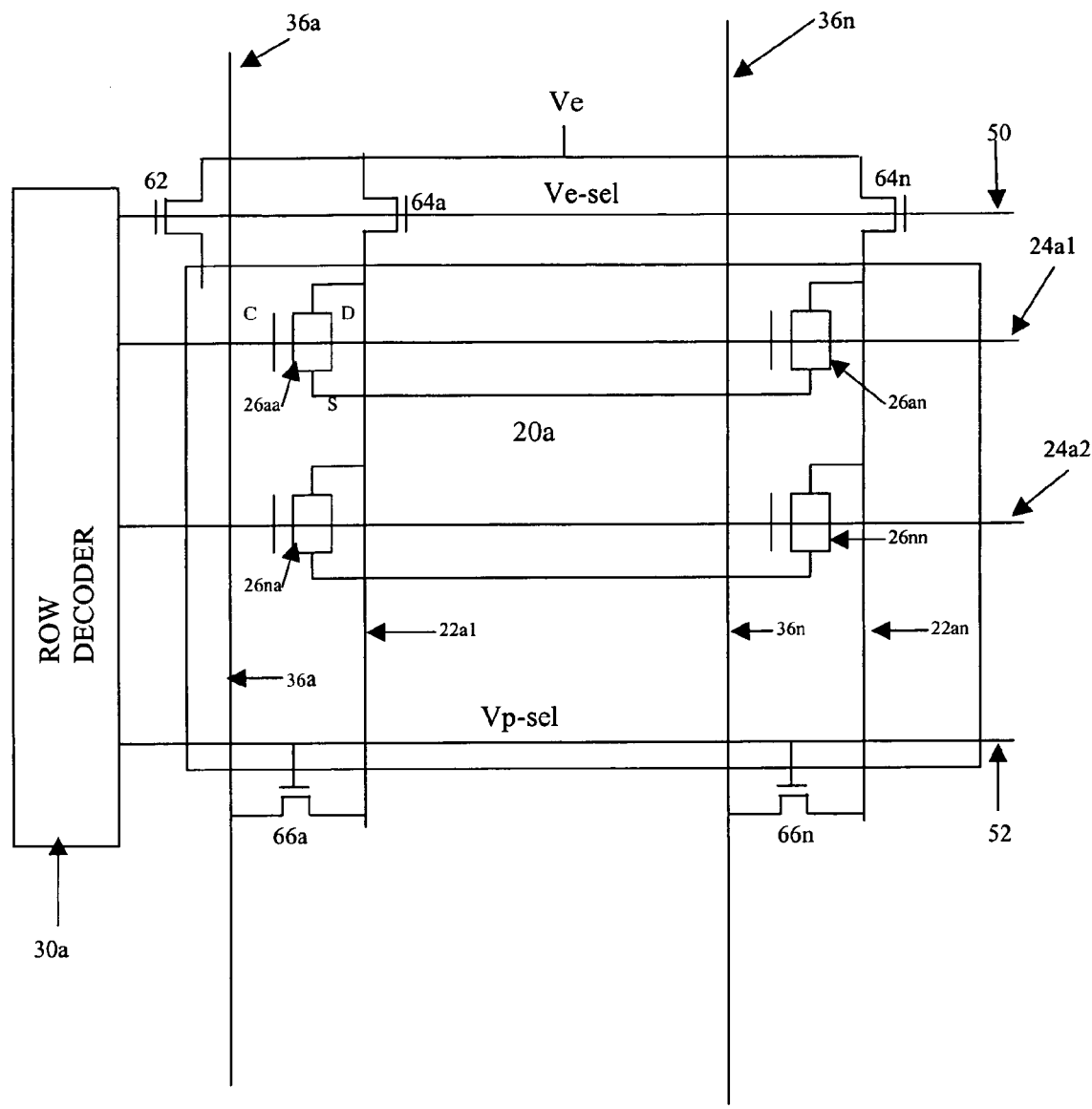
FIG. 2 is a detailed block level diagram of one block in the nonvolatile memory device of the present invention shown in FIG. 1.

As shown in FIG. 2, each memory cell 26 has three terminals: a terminal labeled "C" (for "control gate"), a terminal labeled "D" (for the "drain"), and a terminal labeled "S" (for "source"). However, it should be understood that the terminology of source and drain may be interchanged. With respect to the memory cell shown and described in U.S. Pat. No. 5,029,130, the terminal labeled "C" corresponds to the control gate 29 shown in FIG. 1 thereof, the terminal "D" corresponds to the terminal 14 shown in FIG. 1 thereof, and the terminal labeled "S" corresponds to the region 16 shown in FIG. 1 thereof. Since the operation of erasure of the memory cell 26 of the type as shown and disclosed in U.S. Pat. No. 5,029,130 operates by Fowler-Nordheim tunnel of electrons from the floating gate to the control gate, where an erase voltage is applied to the control gate, in the present invention it is unnecessary to have the second select line 50, the second select switches 64 and third select switch 62 and the erase voltage connected thereto.

In the operation of the memory device 10, when a block 20a is desired to be erased and a block 20b is desired to be programmed, this condition is detected by the control circuit 40, which activates the switches and the row decoders as explained hereinafter. The control circuit 40 detects this condition, i.e., the operation of erase and the operation of program occurring in different blocks 20 and accordingly act thereupon. If block 20a is desired to be erased, then the erase voltage is applied to each of the row lines 24a1 . . . 24an for block 20a. This causes the electrons on the floating gate to Fowler-Nordheim tunnel to the control gate which are connected to the source of erase voltage on the row lines 24a1 . . . 24an.

In block 20b which is desired to be programmed, the select bits are determined by the column decoder 34 and applied to the particular global column lines 36. The first select line 52 of block 20b is activated connecting each of the global column lines 36 to its respective local bit line 22b1 . . . 22bn. The voltage on the global column line 36 is then passed through the first select switch 66 and onto the local bit line 22b. If, for example, the memory cell 26 connected to the local bit line 22b is to be programmed, i.e., have electrons injected onto the floating gate, then the global column line 36a would have the programming voltage supplied thereto which would be supplied to the local bit line 22b1. The particular cell is activated by having the appropriate row line 24b activated thereby turning on the channel conduction all as described in U.S. Pat. No. 5,029,130. The selected memory cell 26 which is selected for programming occurs at the intersection of the activated row line 24 and the activated local bit line 22 connected to the global column line 36.

For other types of memory cells 26 where erasure occurs by a different mechanism, e.g. where the entire substrate or the well in which all the memory cells 26 reside within that block 20, then the erase voltage is applied to the well through the third select switch 62 which is activated by the second select line 50. Other mechanism to erase memory cells 26 in a selected block 20 may be by supplying the erase voltage Ve through the second select switches 64 onto the "D" terminal of each of the memory cell 26, or even to the "S" terminal of each of the memory cells 26. During this operation, of course, each of the first select switches 66 would remain off. The particular connection of the erase voltage to the memory cells 26 in a selected block 20 for erasure would depend on the erase behavior of the memory cell 26.

What is claimed is:

1. A non-volatile memory device comprising:
   an array of non-volatile memory cells arranged in a plurality of blocks;
   each block having a plurality of non-volatile memory cells arranged in a plurality of rows and columns; a plurality of local bit lines in each block not extending to an adjacent block with each local bit line connecting cells in the same column; a plurality of row lines in each block with each row line connecting cells in the same row;
   a plurality of global column lines, each global column line associated with a plurality of local bit lines with each local bit line from a different block;
   a plurality of switches in each block, each switch for connecting a local bit line to its associated global column line; each switch being activatable by a switch signal supplied on a select line connected to the switch;
   a row decoder connected to the plurality of row lines and the select line of each block;
   a column decoder connected to the plurality of global column lines; and
   a controller circuit for determining when memory cells of a first block are to be erased and when memory cells of a second block are to be programmed and to activate the row decoder associated with said second block to cause the switches of said second block to connect the local bit lines of said second block to the global column lines causing simultaneous erasure of memory cells of said first block and programming of memory cells of said second block.

2. The device of claim 1 wherein said select line of a block connects all the switches of said block.

3. The device of claim 1 wherein each memory cell has a first terminal connected to a local bit line, and a second terminal connected to a row line;
   wherein in a programming mode, a select memory cell of said second block is selected by a first voltage applied to a select global column line connected to a select local bit line of said second block to said first terminal of said select memory cell; and a second voltage applied to a select row line of said second block to said second terminal of said select memory cell; and wherein in an erase mode, a third voltage is applied to a select row line of said first block to erase memory cells connected to said select row line.

4. The device of claim 3 wherein in said erase mode, a fourth voltage is applied to all the local bit lines of said first block.

5. The device of claim 1 wherein each memory cell has a first terminal connected to a local bit line, and a second terminal connected to a row line;

wherein in a programming mode, a select memory cell of said second block is selected by a first voltage applied to a select global column line connected to a select local bit line of said second block to said first terminal of said select memory cell; and a second voltage applied to a select row line of said second block to said second terminal of said select memory cell; and wherein in an erase mode, a third voltage is applied to a well in which the memory cells of said first block are formed.

6. The device of claim 5 wherein in said erase mode, a fourth voltage is applied to all the local bit lines of said first block.

7. The device of claim 1 wherein each memory cell is of a split gate type having a first terminal spaced apart from a second terminal in a substrate with a channel region there between, a control gate insulated and spaced apart from a first portion of the channel region, a floating gate insulated and spaced apart from a second portion of the channel region and capacitively coupled to the second terminal, said first terminal connected to the local bit line and said row line connected to the control gate.

8. The device of claim 7 wherein each memory cell is programmed by the mechanism of hot channel electron injection wherein electrons from said first terminal accelerate to the second terminal and are injected onto the floating gate.

9. The device of claim 8 wherein each memory cell is erased by the mechanism of Fowler-Nordheim tunneling of electrons from the floating gate to the control gate.

10. The device of claim 1 wherein each memory cell is of a stacked gate type having a first terminal spaced apart from a second terminal in a substrate with a channel region there between, a floating gate insulated and spaced apart from the channel region, and a control gate insulated and spaced apart from the floating gate, wherein said first terminal is connected to the local bit line and said row line is connected to the control gate.

11. A non-volatile memory device comprising:

an array of non-volatile memory cells arranged in a plurality of blocks;

each block having a plurality of non-volatile memory cells arranged in a plurality of rows and columns; a plurality of local bit lines in each block, each local bit line of a block isolated from local bit lines of another block; each local bit line of a block connecting cells in the same column; a plurality of row lines in each block with each row line connecting cells in the same row;

a plurality of global column lines, each global column line extending across said plurality of blocks in a column direction; each global column line having an associated local bit line in each block;

a plurality of switches in each block, each switch for connecting a local bit line to its associated global column line; each switch being activatable by a switch signal supplied on a select line connected to each switch;

a row decoder connected to the plurality of row lines and the select line of each block;

a column decoder connected to the plurality of global column lines; and a control circuit for erasing memory cells of a first block and for simultaneously activating the row decoder associated with a second block causing the switches of said second block to connect the local bit lines of said second block to the global column lines causing programming of memory cells of said second block.

12. The device of claim 11 wherein said select line of a block connects all the switches of said block.

13. The device of claim 11 wherein each memory cell has a first terminal connected to a local bit line, and a second terminal connected to a row line;

wherein in a programming mode, a select memory cell of said second block is selected by a first voltage applied to a select global column line connected to a select local bit line of said second block to said first terminal of said select memory cell; and a second voltage applied to a select row line of said second block to said second terminal of said select memory cell; and wherein in an erase mode, a third voltage is applied to a select row line of said first block to erase memory cells connected to said select row line.

14. The device of claim 13 wherein in said erase mode, a fourth voltage is applied to all the local bit lines of said first block.

15. The device of claim 11 wherein each memory cell has a first terminal connected to a local bit line, and a second terminal connected to a row line;

wherein in a programming mode, a select memory cell of said second block is selected by a first voltage applied to a select global column line connected to a select local bit line of said second block to said first terminal of said select memory cell; and a second voltage applied to a select row line of said second block to said second terminal of said select memory cell; and wherein in an erase mode, a third voltage is applied to a well in which the memory cells of said first block are formed.

16. The device of claim 15 wherein in said erase mode, a fourth voltage is applied to all the local bit lines of said first block.

17. The device of claim 11 wherein each memory cell is of a split gate type having a first terminal spaced apart from a second terminal in a substrate with a channel region there between, a control gate insulated and spaced apart from a first portion of the channel region, a floating gate insulated and spaced apart from a second portion of the channel region and capacitively coupled to the second terminal, said first terminal connected to the local bit line and said row line connected to the control gate.

18. The device of claim 17 wherein each memory cell is programmed by the mechanism of hot channel electron injection wherein electrons from said first terminal accelerate to the second terminal and are injected onto the floating gate.

19. The device of claim 18 wherein each memory cell is erased by the mechanism of Fowler-Nordheim tunneling of electrons from the floating gate to the control gate.

20. The device of claim 11 wherein each memory cell is of a stacked gate type having a first terminal spaced apart from a second terminal in a substrate with a channel region there between, a floating gate insulated and spaced apart from the channel region, and a control gate insulated and spaced apart from the floating gate, wherein said first terminal is connected to the local bit line and said row line is connected to the control gate.

* * * * *